(12) United States Patent
Scott et al.

(10) Patent No.: US 10,100,140 B2
(45) Date of Patent: Oct. 16, 2018

(54) USE OF POLYMERS COMPRISING TWO SEGMENTS AS POLYMER ADDITIVES

(71) Applicant: Interface Polymers Limited, Loughborough (GB)

(72) Inventors: Peter Scott, Warwickshire (GB); Christopher Kay, Warwickshire (GB); Kenneth Lewtas, Oxfordshire (GB)

(73) Assignee: Interface Polymers Limited, Loughborough (GB)

( * ) Notice: Subject to any disclaimer, the term of this patent is extended or adjusted under 35 U.S.C. 154(b) by 0 days.

(21) Appl. No.: 15/698,892

(22) Filed: Sep. 8, 2017

(65) Prior Publication Data

US 2018/0066097 A1    Mar. 8, 2018

Related U.S. Application Data

(63) Continuation of application No. PCT/EP2016/071299, filed on Sep. 9, 2016.

(30) Foreign Application Priority Data

Sep. 16, 2015 (GB) .................................. 1516400.7

(51) Int. Cl.
*C08F 220/10* (2006.01)
*C08F 297/04* (2006.01)
(Continued)

(52) U.S. Cl.
CPC ........ *C08F 297/048* (2013.01); *C08F 220/10* (2013.01); *C08L 25/14* (2013.01); *C08F 2800/10* (2013.01); *G01R 33/46* (2013.01)

(58) Field of Classification Search
CPC .. C08F 210/16; C08F 295/00; C08F 297/083; C08F 4/65908; C08L 53/00
See application file for complete search history.

(56) References Cited

U.S. PATENT DOCUMENTS 6,114,443 A    9/2000  Lohse et al.
2007/0037927 A1  2/2007  Yang
(Continued)

FOREIGN PATENT DOCUMENTS

EP    2684940 A1    1/2014

OTHER PUBLICATIONS

Feng et al. Polymer 49, 386-393 (Year: 2008).*
(Continued)

*Primary Examiner* — Mark S Kaucher
(74) *Attorney, Agent, or Firm* — The Dobrusin Law Firm, PC

(57) ABSTRACT

Materials having structure (1), wherein R and $R^1$ may be the same or different and each independently represents an alkyl or aryl group, X may be hydrogen or a $C_1$ to $C_{20}$ alkyl group which may be branched or linear and wherein the aromatic ring substituent joined to polymer B is positioned meta or para to the aromatic ring substituent joined to polymer A and, wherein polymer A is a non-polar polymer formed by metallocene catalysis and polymer B is a polymer formed by radical catalysis of a polar monomer are used as polymer additives particularly to improve the compatibility of mixtures of polymers.

(1)

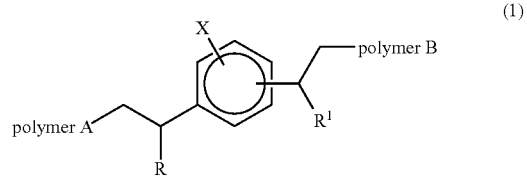

15 Claims, 6 Drawing Sheets

(51) Int. Cl.
  *C08L 25/14* (2006.01)
  *G01R 33/46* (2006.01)

(56) References Cited

U.S. PATENT DOCUMENTS

2015/0011447 A1    1/2015  Waterson et al.
2017/0190995 A1*   7/2017  Theaker ................. C10L 10/16

OTHER PUBLICATIONS

Lu Y et al., Syntheses of diblock copolymers polyolefin-b-poly(αe-caprolactone) and their applications as the polymeric compatilizer, Polymer, Elsevier Science Publishers B.V., GB, vol. 46, No. 23 pp. 10585-10591 (Nov. 14, 2005).

International Search Report and Written Opinion from the European Patent Office for Application No. PCT/EP2016/071299, dated Dec. 13, 2016.

Search Report from the United Kingdom Intellectual Patent Office for Application No. GB1516400.7, dated Mar. 15, 2016.

\* cited by examiner

FIGURE 1

H¹NMR spectrum of PE-t-dib

PS-PE 70/30 Blend + 5% PE-b-PS   PS-PE 70/30 Blend – no additive.

US 10,100,140 B2

USE OF POLYMERS COMPRISING TWO SEGMENTS AS POLYMER ADDITIVES

FIELD

The present invention relates to the use of materials containing two polymeric segments as additives to polymer systems. The additives may provide an interfacial or surface effect on a single polymer, a mixture of polymers and/or a mixture of a polymer and a non-polymeric material. For example, the use of the material may provide a surface effect to polymer compositions. Alternatively the materials may be used as compatibilisers in mixtures of polymeric materials particularly mixtures of immiscible polymeric materials.

BACKGROUND

In the polymer industry it is frequently necessary for an article manufactured from polymers to have a range of properties. For example, a combination of tensile strength and impact resistance may be required, a combination of flexibility and sealability, a combination of stiffness and the ability to be laminated may be required as may flexibility and printability. It is therefore sometimes necessary to blend two or more polymers in order to get the desired combination of properties. In a wide range of applications mixtures of materials are used in order to produce articles benefitting from the combination of the properties of both materials. For example a combination of polar and non-polar materials may be desired. A combination of viscosity (perhaps in the melt) with adhesiveness, a combination of barrier properties and strength and a wide range of other combinations can be required to provide materials having the optimum combination of properties.

A large amount of polymer fabrication is based upon the melt processing of mixtures of polymeric materials and in many instances it is not possible or very difficult to obtain homogeneous mixtures of the materials. Homogeneity is required to enable processing of the formulations into finished articles and also to provide uniform properties within the finished articles. This is particularly the case with mixtures of polymeric materials which are processed in the melt such as by extrusion (including film formation), injection moulding. roto-moulding, blow moulding or thermoforming where a homogeneous mixture of the polymers in the molten state is required for smooth processing and the production of articles having a homogeneous content. By homogeneous we mean that the article has a substantially uniform polymer content throughout the article and we include both miscibility of the polymers and dispersion of polymers one within another.

The incompatibility of different polymers can also present a problem for the recycling of polymeric materials. Recycling is often performed by melt-mixing and reusing plastic materials but it is necessary to separate out different types of plastic in order to enable them to be recycled. Improving the compatibility of polymers such as high density polyethylene and polystyrenes would mean that more polymer waste and types of polymers could be recycled, and that the value and utility of recycled polymers would be improved.

In other embodiments it may also or alternatively be desired to have a particular surface effect on a polymer article. Plastic films for example, may be laminated to other surfaces and they may require an adhesive or sealable surface. Additionally or alternatively they may need to be printable or paintable whilst at the same time having adequate strength and perhaps barrier properties particularly for use in the packaging industry.

Additives have been proposed in order to improve the compatibility of and/or the surface properties of polymer systems. However many of the additives are expensive and additionally do not result in the desired degree of compatibility of the polymeric materials or do not provide the desired surface effect whilst retaining the other desirable properties of the polymers. In particular there remains a need for materials that can improve the compatibility of polymers containing polar groups such as ester containing copolymers and non-polar groups such as polyalkenes.

SUMMARY

The present invention therefore provides a polymeric additive containing two polymeric segments each of which can be tailored according to the use to which the additive is to be put and provides the use of certain polymers comprising two segments to improve the compatibility of two or more polymeric materials or to enhance the surface or interfacial properties.

In a further embodiment the invention provides compositions comprising at least two polymeric materials containing certain two component polymers.

In a further embodiment the invention provides finished articles prepared from the composition of the invention.

The invention further provides the use of certain two segment polymers as polymer additives to provide a desired surface or interfacial effect on articles such as films produced from a polymer system.

The two segment polymers that are used in the present invention comprise a molecule containing two different and linked polymeric segments such as a polymer segment containing a polar monomer linked to a polymer segment based on a non-polar monomer by means of a bifunctional linking group.

DETAILED DESCRIPTION

Block copolymers are described in EP 2684940 B1 comprising a block copolymer containing at least two blocks in which
i) The first block consists of a chain of ethylenic structural units, optionally interrupted by one or more structural units derived from 1-alkene co-monomers higher than ethylene and
ii) The second block comprises a chain of structural units derived from one or more α,β-unsaturated polar monomers selected from styrene, substituted styrene, unsaturated esters such as vinyl esters, acrylate and methacrylate esters and diene compounds
and wherein said first and second blocks of the copolymer are terminally joined by means of the following structural linkage:

wherein each R group independently represents an alkyl or aryl group and $R^1$ represents hydrogen or an alkyl group and wherein the aromatic ring substituent joined to the second block is positioned meta or para to the aromatic ring substituent joined to the first block.

The block copolymers are described as being useful additives for liquid fuels and lubricants.

According to EP 2684940 B1 these block copolymers may be prepared by a process comprising a) In a first step polymerising ethylene and optionally one or more 1-alkene co-monomers higher than ethylene, in the presence of a metallocene catalyst system to form a first polymer block, being a chain consisting of ethylenic structural units optionally bearing pendent alkyl groups originating from 1-alkene comonomer(s), the reaction being carried out in solution at a temperature of at least 50° C. in the presence of a compound of the formula (I):

in a reaction vessel pressurised with hydrogen gas, wherein, in the course of the reaction, the compound (I) is terminally incorporated onto the first polymer block resulting in the formation of a terminally unsaturated intermediate of the formula (II):

b) In a second step, recovering the intermediate (II) from the reaction mixture of the first step and
c) In a third step reacting the intermediate (II) at its terminal double bond in a subsequent anionic polymerisation reaction to form the second polymer block, so yielding a diblock polymer of the structure defined above.

We have now found that block copolymers having the following structure:

wherein R and $R^1$ may be the same or different and each independently represents an alkyl or aryl group, X may be hydrogen or $C_1$ to $C_{20}$ alkyl group which may be branched or linear and wherein the aromatic ring substituent joined to polymer B is positioned meta or para to the aromatic ring substituent joined to polymer A and, wherein polymer A is a non-polar polymer (or copolymer) formed by metallocene catalysis and polymer B is a polymer formed by radical catalysis of a polar monomer (optionally with a non-polar polymer to form a copolymer segment) are useful as additives to polymer systems.

In a preferred embodiment
i) polymer A consists of a chain of ethylenic structural units, optionally copolymerised with 1-alkene co-monomers higher than ethylene, and
ii) polymer B is derived from one or more α,β-unsaturated monomers selected from styrene, substituted styrene, unsaturated esters such as acrylate, methacrylate and vinyl esters, fumarate esters, itaconate esters, maleic anhydride and diene compounds and derivatives thereof, polymer B may comprise a copolymer of such unsaturated monomers with an alkene such as $C_2$ to $C_8$, preferably $C_2$ to $C_6$ alkenes.

These polymers may be prepared by
a) in a first step, polymerising alkenes such as ethylene, and optionally one or more 1-alkene co-monomers higher than ethylene, in the presence of a metallocene catalyst system to form polymer A, being a chain consisting of ethylenic structural units optionally bearing pendent alkyl groups originating from 1-alkene comonomer(s), the reaction being carried out in the presence of a compound of the formula (I):

in a reaction vessel wherein, in the course of the reaction, the compound (I) is terminally incorporated onto polymer A resulting in the formation of a terminally unsaturated intermediate of the formula (II):

b) in an optional second step, recovering the intermediate (II) from the reaction mixture of the first step; and c) in a third step, reacting the intermediate (II) at its terminal double bond with a polar monomer (optionally copolymerized with a non-polar monomer (e.g. ethylene)) in a subsequent radical polymerisation reaction to form polymer B.

where R, R1 and X are as previously defined.

Optionally step a) may be performed under hydrogen pressure in order to control the characteristics of polymer A.

In this specification, the word "terminal" when used in relation to a polymer chain (or block) simply refers to the end of the polymer chain (or block), and does not convey any additional mechanistic requirement that the chain (or block) end in question be the end at which the polymerisation reaction terminated. References to "terminally" shall be construed analogously.

The production of polymer B by radical polymerisation is more versatile than the production by anionic polymerisation according to EP 2684940. Radical polymerisation is easier to control and the materials produced are more readily purified. Radical polymerisation is more versatile in the range of monomers that may be polymerised, and it is easier to control molecular weight within a selected range as compared with the methods of EP 2684940. Accordingly use of radical polymerisation to produce polymer B enables the structure of the additive used in this invention to be more easily tailored to the use for which it is designed. The selection of the chemical nature, the structure and physical properties of polymer A and polymer B can therefore be tailored according to the particular use envisaged for the material. For example either or both of polymers A and B may be homopolymers or copolymers, they may be crystalline or amorphous, they may be linear or branched and may be of any desired molecular weight any comonomer content.

We have found that these materials are excellent compatibilisers in mixtures of polymeric materials particularly mixtures of polar and non-polar materials or mixtures of polymeric materials of varying polarity. For example they may be used as compatibilisers in mixtures of polyolefins and ester group-containing materials such as polyesters or alkene unsaturated ester copolymers such as olefin vinyl acetate or acrylate ester copolymers. Additionally they are useful as compatibilisers in adhesive formulations based on polar copolymers such as olefin/unsaturated ester copolymers and hydrocarbon block copolymers such as styrene butadiene or isoprene multi-block copolymers (which can be optionally hydrogenated). They can also be used in polymer recycling to enable mixtures of otherwise incompatible polymers to be effectively recycled.

The nature of polymer A and polymer B in the materials used in the present invention may be selected according to the nature of the two or more polymeric materials that are to be combined in a particular formulation. For example, polymer A may have a backbone chain of polyethylenic structural units optionally incorporating in the backbone chain, units derived from 1-alkenes higher than ethylene, such that the resulting polymer chain remains an uninterrupted sequence of saturated aliphatic carbon atoms, the residual alkyl groups of the 1-alkene residues being borne as saturated alkyl substituents pendant from the polymer chain.

It is important that polymer A be terminally joined to polymer B, so as to leave polymer A exposed for interacting with the polymer system with which it is used. As such, it is important that the linkage between polymer A and polymer B be positioned at the end of the polymeric chain of polymer A.

To achieve this terminal positioning of the linkage between polymer A and polymer B, it is essential that the process by which the copolymer is made be specific for terminal functionalization of polymer A. Equally, it is important that the terminal functionalization formed on polymer A be sufficiently reactive to enable the subsequent formation of polymer B under radical polymerisation conditions that are industrially practical, whilst at the same time not being so highly reactive that unwanted side reactions occur to a significant extent.

Preferred materials for use in this invention are those in which polymer A comprises a chain of ethylenic structures optionally interrupted by one or more structural units derived from 1-alkene comonomers and polymer B comprises a chain of structural units derived from one or more α,β-unsaturated monomers selected from styrene, substituted styrene, unsaturated esters such as acrylate and methacrylate esters, vinyl esters, fumarate esters, itaconate esters, maleic anhydride and diene compounds and derivatives thereof, polymer B may be a copolymer of such monomers with alkenes such as C2 to C8 alkenes.

The materials used in this invention may be prepared by a process comprising the following steps:

a) in a first step, polymerising an alkene typically ethylene, and optionally one or more 1-alkene co-monomers higher than ethylene, in the presence of a metallocene catalyst system to form polymer A, the reaction being carried out in the presence of a compound of the formula (I):

wherein, in the course of the reaction, the compound (I) is terminally incorporated onto polymer A resulting in the formation of a terminally unsaturated intermediate of the formula (II):

b) optionally, in a second step, recovering the intermediate (II) from the reaction mixture of the first step; and c) in a third step, reacting the intermediate (II) at its terminal double bond in a subsequent radical polymerisation reaction with a polar monomer to form polymer B.

wherein R, $R^1$ and X are as previously defined.

The process aspect of step c) is preferably carried out in the presence of a radical source which initiates polymerisation of one or more α,β-unsaturated monomers. Examples of such monomers include styrene, substituted styrene, unsaturated esters such as acrylate and methacrylate esters, vinyl esters, fumarate esters, itaconate esters, unsaturated anhydrides such as maleic anhydride and diene compounds and derivatives thereof. As will be known in the art, such a radical source may be a chemical initiator species or it may be an external physical input to the reaction such as light or other radiation source. Preferably the radical source is a chemical initiator species such as a peroxide initiator, an azo-initiator or other such species.

Accordingly in a preferred embodiment the material used in this invention comprises two polymeric segments A and B wherein:
i) polymer A comprises a chain of ethylenic structural units, optionally interrupted by one or more structural units derived from 1-alkene co-monomers higher than ethylene, and
ii) polymer B comprises a chain of structural units derived from one or more α,β-unsaturated monomers selected from styrene, substituted styrene, unsaturated esters such as acrylate, methacrylate, and vinyl esters, fumarate esters, itaconate esters, maleic anhydride and diene compounds and derivatives thereof, polymer B may comprise a copolymer of such unsaturated monomers with an alkene such as $C_2$ to $C_8$ preferably $C_2$ to $C_6$ alkenes;
and wherein polymer A and polymer B are terminally joined such that the copolymer has the structure:

wherein R, $R^1$ and X are as previously defined and wherein the aromatic ring substituent joined to polymer B is positioned meta or para to the aromatic ring substituent joined to polymer A.

Preferably, each R and $R^1$ group independently represents an alkyl group having from 1 to 4 carbon atoms. More preferably, R and $R^1$ are the same and most preferably are both methyl.

Preferably, the aromatic ring substituent joined to polymer B is positioned meta to the aromatic ring substituent joined to polymer A.

In one preferred embodiment, polymer A in the material used in this invention consists of a polyethylene chain.

In one preferred embodiment, polymer A in the material used in this invention consists of a polypropylene chain.

In one preferred embodiment, polymer A in the material used in this invention consists of an ethylene-propylene copolymer.

In another preferred embodiment, polymer A in the material used in this invention consists of an ethylene 1-hexene copolymer.

In another preferred embodiment, polymer A of the material used in this invention consists of an ethylene 1-octene copolymer.

If desired Polymer A may after formation be provided with some polarity by the grafting of unsaturated monomers such as maleic anhydride onto Polymer A.

When one or more 1-alkene monomers are used in conjunction with ethylene to form polymer A preferably the total proportion of 1-alkene monomers is between 1 and 50 mol %, preferably between 2 and 40 mol %, the remainder of polymer A being derived from ethylene.

In one preferred embodiment, polymer B of the material used in this invention consists of a chain of structural units derived from one or more α,β-unsaturated monomers selected from styrene, substituted styrenes, acrylate and methacrylate esters, diene compounds, vinyl esters, fumarate esters, itaconate esters and maleic anhydride and derivatives thereof. In a particularly preferred embodiment, polymer B of the material used in this invention consists of a homo- or copolymeric chain derived from one or more acrylate or methacrylate monomers. In particular, the (meth) acrylate monomer or monomers selected for polymer B comprise one or more (meth)acrylate compounds bearing a $C_4$-$C_{22}$ alkyl substituent, which may be branched or straight chain alkyl. In an example of a preferred material used in this invention polymer B consists of a homo- or polymeric chain derived from one or more such monomers. Examples of such monomers are: 2-ethyl hexyl (meth)acrylate, isodecyl (meth)acrylate, t-butyl (meth)acrylate, dodecyl (meth) acrylate, decyl(meth)acrylate, and those with a $C_{12}$-$C_{15}$ chain length.

In another preferred embodiment, polymer B of the material used in this invention consists of a homo- or copolymeric chain derived from one or more vinyl ester monomers. Examples include vinyl acetate, vinyl 2-ethylhexanoate, vinyl octanoate, vinyl benzoate, vinyl decanoate, vinyl neodecanoate, vinyl pivalate, vinyl propionoate, vinyl stearate and vinyl valerate.

In another preferred embodiment, polymer B of the material used in this invention consists of a chain of structural units derived from one or more diene compounds. These dienes may be unhydrogenated, hydrogenated or partially hydrogenated dienes. More preferably, the second block of the copolymer consists of a homo- or copolymeric chain derived from isoprene, piperylene or butadiene, or a mixture thereof.

In another preferred embodiment polymer B of the material used in this invention consists of a chain, of styrenic structural units derived from styrene or derivatives thereof such as alpha methyl styrene, para alkyl styrene such as methyl and butyl styrene.

Suitable metallocene catalysts for the production of polymer A comprise a transition metal, particularly a metal from group IV of the periodic table such as Ti, Zr or Hf, with one or more ligands such as cyclopentadienyl ("Cp"), substituted cyclopentadienyl (including indenyl, fluorenyl and their derivatives), and bridged variants of the above. Additional ligands may be coordinated or bonded to the metal by heteroatoms such as N, O, S or P and may include bridges to Cp-type ligands as above.

Such catalysts are normally synthesised and stored as a metal dichloride/dialkyl (e.g. dibenzyl) or mono-alkyl-mono-chloride species ("pre-catalyst"). This is activated in solution by addition of a co-catalyst, generally methylaluminoxane (MAO), but alternatively a non/weakly-coordinating anion may be used such as a combination of a boron containing species such as $Ph_3C+B(C_6F_5)_4-$ and a trialkylaluminium species such as $i$-$(C_4H_9)_3Al$.

Examples of such catalysts include $Cp_2MCl_2$, $Cp^*_2MCl_2$, $EBIMCl_2$, $Flu(Ph_2Me)CpMCl_2$, and $Cp(Me)_4(Me_2Si)Nt$-$BuMCl_2$, wherein M represents a transition metal. Preferred catalysts are catalysts in which M represents zirconium. An example catalyst is $Cp_2ZrCl_2$ together with a co-catalyst.

The following Example 1 illustrates the preparation of materials in which Polymer A is polyethylene that may be used in this invention.

Production of PE-t-DIB

A 250 ml stainless steel Parr reactor with internal cooling coil was dried under vacuum at 100° C. for 1 hour before addition of a comonomer solution consisting of toluene (50 ml), 1,3-diisopropenylbenzene (30 ml, 0.175 mol—compound (I)) and MAO solution (3 ml, 1800 equivalents) via cannula with the reactor initially heated to 50° C. The reactor was purged for 5 min with hydrogen (240 kPa) before the addition of ethylene (85 kPa). Once ethylene uptake had stabilised, a toluene solution of metallocene catalyst $Cp_2ZrCl_2$ ($2.5\times10^{-6}$ mol) prepared in the glove box was injected using an overpressure of argon. After catalyst addition, the temperature and gas uptake were continuously monitored. The reaction temperature was maintained at 60° C. The reaction was stopped after 15 min by careful addition of methanol (2×10 ml). The polymer product was precipitated by pouring into a solution of 5% HCl in methanol (600 ml) with stirring for 1 h. The product was recovered by filtration and washed with methanol, and once dry washed again with tetrahydrofuran (200 ml). The polymer product, 1,3-diisopropenylbenzene terminated polyethylene (compound (II), being PE-t-DIB) was dried by heating to 70° C. in vacuo for 24 h, giving a yield of 2.655 g.

The 1,3-DIB content of the resulting polymer (compound (II)) was 2.54 mol % and it had an Mw of 3269 g mol$^{-1}$, an $M_n$ of 1893 g mol$^{-1}$, and Dispersity (PDi) of 1.73, as measured by high temperature GPC performed in 1,2,4-trichlorobenzene at 160° C. at a flow rate of 1 ml/min on a Polymer Labs PL220 fitted with a 5 cm PLgel guard column (5 μM), and two PLgel 30 cm Mixed-D columns (5 μM). Calibration was achieved using Polymer Labs PS-M Easivial polystyrene standards. The molecular weight is determined by comparing the retention time of the polymer with that of the calibration curve at that retention time.

The characterisation of compound (II), to confirm the desired terminal functionalisation structure is obtained, can be conducted by nuclear magnetic resonance spectroscopy.

For example, NMR spectra can be recorded on Bruker DPX400 and DPX500 spectrometers, wherein $^1H$ and $^{13}C$ NMR spectra are referenced internally using the solvent resonances relative to tetramethylsilane. Routine NMR assignments (including polymer samples) can be confirmed by $^1H$-$^1H$ (COSY), $^{13}C$-$^1H$ (HMQC) and $^{13}C$-$^1H$ (HMBC) correlation experiments where necessary.

In particular, to confirm the terminal insertion of the compound (I), $^1H$ NMR spectroscopy can be employed. Determination of the amount of terminal insertion is achieved by comparison of the spectroscopic peaks for a methyl group at one end of the polyethylene chain which has three protons (labelled A in the figure), and a single proton on the benzylic carbon of the 1,3-DIB molecule remaining after step a) of the reaction (labelled B in the figure). Any 1,3-DIB incorporated in-chain would not have a proton on this carbon, and thus this proton resonance serves to distinguish terminal insertion of the 1,3-DIB.

The $^1H$ NMR peaks associated with these protons have chemical shifts of 0.91 ppm and 2.71 ppm respectively (chemical shifts are measured against the residual solvent signal in $d_2$-TCE at 5.94 ppm). Comparing the integrals of these two peaks gives the amount of terminal insertion by 1,3-DIB. As can be seen for example in the spectrum shown, an integrals ratio of the respective peaks of 3:1 (A:B) indicates that essentially each polyethylene chain is terminally functionalised by the residue from the 1,3-DIB.

An advantage of the process used is in securing a high degree of terminal functionalization of the first block, as determined by the above spectroscopic method. Further examples of step a) of the process and the results achieved are shown below:

Further examples of compounds of formula (II) were prepared by using mixtures of ethylene and a 1-alkene instead of ethylene alone to produce polymer A. Examples using a mixture of 1-hexene and ethylene gave compounds of formula (II) with molecular weights (Mn) of around 4,000 using a $Cp_2ZrCl_2$ catalyst and around 8,000 when an Et(Ind)$ZrCl_2$ catalyst was used. A $Cp_2ZrCl_2$ catalyst was used to react a mixture of ethylene and 1-octene to give a compound of formula (II) having a molecular weight (Mn) of around 5,000.

In each case, the reactions resulted in essentially complete terminal functionalization of the polyethylenic or polyethylene/1-alkene chains by co-monomer compound (I), so forming compound (II) to a highly specific degree.

If desired, the compound II can be isolated as demonstrated in the worked example 1, or by other means of recovery known to the polymer chemist.

The third step c) of the process involves the formation of polymer B by way of a radical polymerisation. The following examples show how this may be done.

Polymer B—Polybutylacrylate 1,3-diisopropenylbenzene terminated polyethylene (PE-t-DIB, Mn=3,300, 0.20 g, $6.1\times10^{-5}$ mol), n-butyl acrylate (0.87 ml, $6.1\times10^{-3}$ mol) and benzoyl peroxide (75%, 0.20 g, $6.1\times10^{-4}$ mol) were charged to a 10 ml glass ampoule equipped with a stirrer bar. The volume was made up to 8.2 ml with toluene. The ampoule was sealed and freeze-thaw degassed three times before being heated to 125° C. with stirring for 128 minutes. The reaction mixture was then cooled rapidly by immersing the ampoule in liquid nitrogen and then poured into methanol (200 ml) with stirring. The precipitate so formed was allowed to settle and then was filtered and dried under vacuum. This yielded 0.34 g of copolymer having an Mn of 5,500.

Polymer B—Polystyrene

The synthesis above was repeated replacing the n-butyl acrylate with styrene (3.5 ml, 0.03 mol). This yielded 1.40 g of copolymer having an Mn of 15,000.

Example 2 illustrates the production of materials that may be used in this invention in which Polymer A is an ethylene/1-hexene copolymer.

Synthesis of a Polyethylene/1-Hexene (Polymer A)—Polybutylacrylate (Polymer B)

1,3 diisopropenylbenzene terminated polyethylene/1-hexene (P(E/H)-t-DIB, Mn=3,900, 6.2 mol % 1-hexene, 0.20 g, $5.1\times10^{-5}$ mol), n-butyl acrylate (0.74 ml, $5.1\times10^{-3}$ mol) and benzoyl peroxide (75%, 0.17 g, $5.1\times10^{-4}$ mol) were charged to a 10 ml glass ampoule equipped with a stirrer bar. The volume was made up to 8.2 ml with toluene. The ampoule was sealed and freeze-thaw degassed three times before being heated to 125° C. with stirring for 128 minutes.

The reaction mixture was then cooled rapidly by immersing the ampoule in liquid nitrogen and then poured into methanol (200 ml) with stirring. The precipitate so formed was allowed to settle and then was filtered and dried under vacuum. This yielded 0.39 g of copolymer having an Mn of 7,000.

Synthesis of a Polyethylene/1-Hexene (Polymer A)—Polystyrene (Polymer B)

The synthesis above was repeated replacing the n-butyl acrylate with styrene (2.9 ml, 0.026 mol). This yielded 0.69 g of copolymer having an Mn of 29,000.

According to this invention the two component copolymers are used as additives to other polymer systems and they are used to impart one or more different properties to the polymer system. Many polymer systems are blends of two or more polymers and the polymer systems are fabricated to produce finished articles by various techniques such as injection moulding, roto-moulding, thermoforming, extrusion perhaps followed by stretching, blow moulding, vacuum forming, casting, lamination and other similar processes.

In almost every instance it is important to have the desired degree of compatibility between the polymers in order to have the desired homogeneity in the finished articles whether it be dispersion of one polymer within another or polymer miscibility. One use of the materials according to this invention is therefore to improve the compatibility of different polymers in polymer blend formulations. Examples of one such use is in extrusion coating, lamination including film lamination such as in the production of laminates of polyester film, polyethylene film, foil and a further layer of polyethylene. Here it can be difficult to achieve the desired adhesion between the layers and corona discharge is often used to enhance the surface adhesion of the layer(s). According to this invention a material in which polymer A is a polyalkene, preferably polyethylene and polymer B is based on a polar monomer such as polyvinyl acetate or polyvinyl alcohol block (formed via the hydrolysis of polyvinyl acetate) is included in the polyester or polyethylene layer of the laminate to improve the adhesion of the layers and perhaps avoid the need for corona discharge treatment. Alternatively the material could be used as a tie-layer between dissimilar polymer layers such as a polyethylene and a polyester layer or a polyethylene and a polystyrene layer. In this instance materials in which polymer A is a polyalkene preferably polyethylene and polymer B is of a polar monomer such as an ester for example, an acrylate such as butyl acrylate or polystyrene could be used.

Another use according to this invention would be to provide improved hardness or stiffness to a polyolefin based polymer system for example, in polymer blends that are used as adhesives such as those containing styrenic block copolymers such as styrene isoprene multi-block copolymers. Here a material used according to the invention could be one in which polymer A is an ethylene/higher ($C_4$ to $C_8$) alkene copolymer such as an ethylene hexene copolymer and polymer B is polar such as a polystyrene. Conversely another use of the materials according to the invention could be to increase the impact resistance of hard engineering thermoplastics such as polystyrenes, acrylonitrile/butadiene/styrene copolymers, other polyaromatic polymers and polycarbonates where elastomers such as ethylene propylene elastomers are used as impact modifiers. A material such as one in which polymer A is a polyalkene such as an ethylene/butene copolymer and polymer B is polystyrene, or a polyacrylate such as polymethyl methacrylate or polyvinyl acetate is extremely useful.

Another use according to this invention is to enable recycling of otherwise incompatible polymers. Recycling involves comminution of polymeric articles and melt processing typically to produce pellets of recycled polymer useful for further processing into finished articles. Addition of the materials used in this invention to the recycling of different, perhaps incompatible polymers can remove the need for separation out of incompatible polymers and provide a recyclable mixture to produce a more uniform reusable material.

Another use according to this invention is to provide interfacial activity such as that required in heat laminating of polymers and/or in providing a printable or a paintable surface, also in agricultural films to increase their surface tension to prevent water beading and in various cling films such as domestic cling film, cling films used for the protection of materials such as automobiles, during transport, other agricultural films such as silage wrap and baling.

Examples of the need for improved heat laminating are to provide a sealable surface to a polyolefin film such as a polyethylene or polypropylene film. Here the addition of a material in which polymer A is a polyolefin and polymer B is polar such as a polymer of an acrylate monomer such as butyl acrylate can be very useful. Similarly if it is desired to provide a printable or paintable surface to a polyolefin material such as for packaging films, sacks, refuse disposal bags, automotive parts such as bumpers, etc., a material in which polymer A is a polyalkene such as polyethylene and polymer B is of a polar monomer such as vinyl acetate, acrylates such as methyl acrylate and butyl acrylate or itaconate esters can be used. These materials can also be included in agricultural films to increase the surface tension of the surface to avoid water beading and in cling films in order to increase their ability to cling to articles.

A further use according to this invention can be to reduce the friction or surface tension of a polymer film as is required in engineering thermoplastics which are to be sealed at relatively low temperatures. A material in which polymer A is of one or more olefins and polymer B is of a polar monomer such as styrene or an ester is particularly useful in this application.

Likewise the materials can be used as hardeners or softeners for high molecular weight solid waxes such as polyethylene wax and polymer A and polymer B in the material used may be selected according to the properties to be imparted to the wax.

The invention can be applied to all polymer families including thermoplastics, thermosets, composite materials and hybrid materials (see for examples those described in Thermoplastic and Thermoplastic Composites by M. Biron, Elsevier, 2007).

The invention may also be applied to all polymer processing methods (ref: handbook of plastics, elastomers & Composites, C. A. Harper, McGraw-Hill, $4^{th}$ Ed., 2002) and one particular use is in recycling and in recycled polymeric materials (ref: Introduction to Plastics Recycling, V. Goodship, Smithers Rapra, $2^{nd}$ Ed., 2007).

The following are examples of the invention where the materials may be used as polymer additives.

Additives to single polymer systems:
  Additives to polyethylenes including polyethylene. Includes PE-based waxes modifying hardness and viscosity.
  Modifying the surface or interfacial properties of polymers (including waxes), e.g. to provide surface adhesion, anti-adhesion, friction, surface tension etc.
  Viscosity modifiers for polymers, providing strength, viscosity, etc. for all polymer processing methods, including moulded articles, film, fibre, etc.
  Property enhancing effects. Improving the dispersion and effectiveness of additives for polymers. Property enhancers: (e.g. sensorial and mechanical properties this includes effectiveness as a plasticiser or in conjunction with another plasticiser, etc.). Processing improvers (e.g. rheology modifiers, lubricants, release agents, etc.). Long-term behaviour (e.g. anti-oxidants, anti-UV, heat ageing, weathering, etc.). Economic factors (e.g. fillers, foaming agents, recycled content, etc.). Special effects (friction, conductivity, tribology, electromagnetic interactions by dispersing the particles responsible for such interactions). Biodegradability (enhancing the dispersion of such systems).

Additives to mixtures of polymers, from the melt, particularly (but not exclusively) solvent free systems:

Mixed stream recycling, polyolefin-polar polymer blends, such as PE-PS, PE-acrylic.

Impact modification of hard plastics. Dispersion of elastomer particles in engineering thermoplastics, e.g. PS, Nylon, ABS, etc.

Processing of mixed polymers. All moulding applications (including but not limited by injection-, roto-, compression-, compression-transfer-, slush, blow-, thermoforming). All extrusion applications (including but not limited by, pipe and tube, coextrusion, film formation, coating, laminating, blown-film, tie-layers, calendaring, welding etc). All casting applications.

Additives for mixed polymers formulations:

Hot Melt Adhesives (HMAs). PO-based. EVA-based.

Pressure Sensitive Adhesives (PSA). SBC-based. Acrylic-based.

Water-based Adhesives (WBA). Acrylic-based.

Additives for heavy oil fractions including bitumen modification.

Additives to control polymer foaming.

Additives for viscosity and dispersion control in preventative systems, e.g. anti-corrosion formulations.

Additives for polymer composites (including reinforced materials, nano-composites and bio-composites):

Additives for construction materials such as panel boards to modify viscosity, dispersion and control wax coatings.

Reinforced articles, e.g. glass (or nylon, carbon, aramid etc)—fibre reinforced polymers, etc.

Carbon-based composites such as carbon black, graphene or carbon nanotube (CNT) filled composites.

"Smart" material composites such as polymer composites containing materials which interact with electromagnetic radiation.

Bio-composites such as wood-plastic composites.

Dispersion of other additives and colourants in polymers.

Additives for polymers—solutions:

Viscosity modifiers for vegetable oils.

Additives to water base polymer systems:

Water-based formulations such as adhesives (foamable or otherwise), coatings and paints.

Polymer additives for crystal modification:

Ethylene polymer and copolymer based crystal modification including waxes (natural or synthetic).

Ethylene polymer and copolymer crystal modification.

Polar polymer crystal modification, such as in polyamides.

The present invention is illustrated by reference to the following further Examples which show the manufacture of the compound used as a compatibiliser in blends of high density polyethylene and polystyrene which are known to be incompatible and currently need to be separated in recycling.

EXAMPLE 3

Preparation of Polyethylene/Diisopropenyl Benzene Intermediate

A 250 ml stainless steel pressure reactor with internal cooling coil was dried under vacuum at 100° C. for 1 hour before addition of a comonomer solution (total volume 90 ml) consisting of 1,3-diisopropenylbenzene (33 ml, 0.193 mol—compound I), methyl aluminoxane (MAO) solution (3 ml, 1800 equivalents) and toluene with the reactor initially heated to 50° C. The reactor was purged for 10 minutes with hydrogen (552 kPa) before the addition of ethylene (138 kPa). Once ethylene uptake had stabilised, a toluene solution of metallocene catalyst $Cp_2ZrCl_2$ ($2.5 \times 10^{-6}$ mol) was injected. The reaction temperature was maintained at 60° C. The reaction was stopped after 30 min by addition of methanol ($2 \times 10$ ml). The polymer product was precipitated by pouring into a solution of 5% HCl in methanol (600 ml) with stirring for 1 hour. The product was recovered by filtration and washed with methanol, and once dry washed again with tetrahydrofuran (200 ml). The polymer product, 1,3-diisopropenylbenzene terminated polyethylene (referred to as PE-t-DIB) was dried by heating to 70° C. in vacuo for 24 h, giving a yield of 15.6 g. This corresponds to a productivity of 12,500 kg polymer/mol[Zr].h.

The 1,3-DIB content of the polymer was 1.70 mol % and it had an $M_w$ of 7434 g mol$^{-1}$, an $M_n$ of 3630 g mol$^{-1}$, and Dispersity (PDi) of 2.05, as measured by high temperature GPC which was performed in 1,2,4-trichlorobenzene at 160° C. at a flow rate of 1 ml/min on a Polymer Labs PL220 fitted with a 5 cm PLgel guard column (5 μM), and two PLgel 30 cm Mixed-D columns (5 μM). Calibration was achieved using Polymer Labs PS-M Easivial polystyrene standards. The molecular weight is determined by comparing the retention time of the polymer with that of the calibration curve at that retention time.

The characterisation of the PE-t-DIB, to confirm the desired terminal functionalisation structure is obtained, can be conducted by nuclear magnetic resonance spectroscopy.

For example, NMR spectra can be recorded on Bruker DPX400 and DPX500 spectrometers, wherein $^1H$ and $^{13}C$ NMR spectra are referenced internally using the solvent resonances relative to tetramethylsilane. Routine NMR assignments (including polymer samples) can be confirmed by $^1H$-$^1H$ (COSY), $^{13}C$-$^1H$ (HMQC) and $^{13}C$-$^1H$ (HMBC) correlation experiments where necessary.

Figure 1:
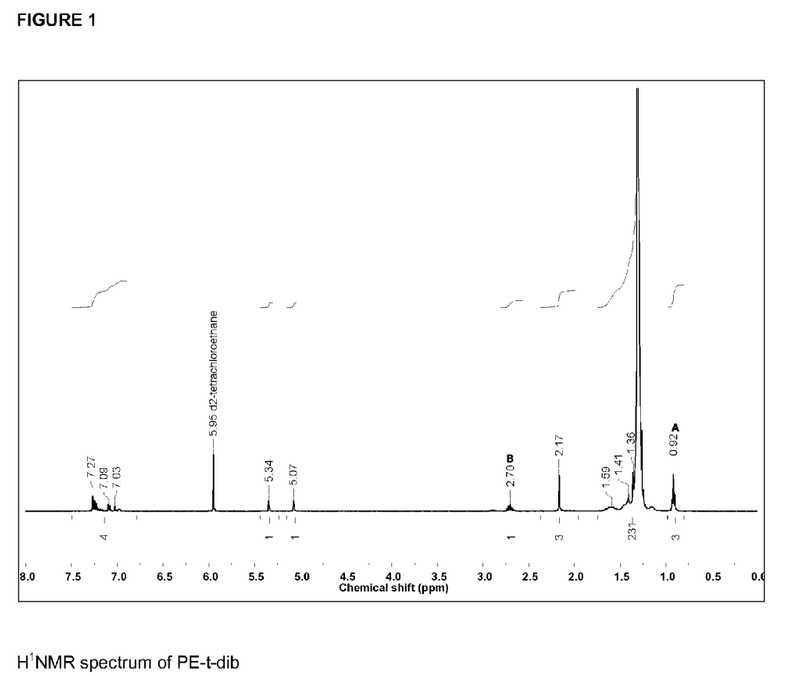
FIG. 1 is $H^1$NMR spectra for PE-t-dib as described in the present disclosure.

In particular, $^1H$ NMR spectroscopy can be employed to confirm the terminal insertion of the compound I. FIG. 1 is a typical $^1H$ NMR spectra for PE-t-DIB as produced by the above process, where polymer A is polyethylene, and 1,3-diisopropenylbenzene ("1,3-DIB"). Determination of the amount of terminal insertion is achieved by comparison of the spectroscopic peaks for a methyl group at one end of the polyethylene chain which has three protons (labelled A FIG. 1), and a single proton on the benzylic carbon of the 1,3-DIB molecule remaining after step a) of the reaction (labelled B FIG. 1). Any 1,3-DIB incorporated in-chain would not have a proton on this carbon, and thus this proton resonance serves to distinguish terminal insertion of the 1,3-DIB.

The $^1H$ NMR peaks associated with these protons have chemical shifts of 0.92 ppm and 2.70 ppm respectively (chemical shifts are measured against the residual solvent signal in $d_2$-TCE at 5.95 ppm). Comparing the integrals of these two peaks gives the amount of terminal insertion by 1,3-DIB. As can be seen for example in the spectrum shown, an integrals ratio of the respective peaks of 3:1 (A:B) indicates that essentially each polyethylene chain is terminally functionalised by the residue from the 1,3-DIB.

Preparation of PE-b-PS

The 1,3-diisopropenylbenzene terminated polyethylene as prepared above and toluene (191 ml) were charged to a 3-neck 1 L round bottom flask fitted with a thermometer, a condenser and a bubbler and purged with argon for 30 min. A second 250 ml round bottom flask was charged with tert-butyl peroxide (4.68 g, 0.032 mol) and toluene (60 ml) and purged with argon for 30 minutes. The styrene solution was heated to 103° C. and the peroxide solution was added via cannula to start the reaction. After 6 hours, the polymer was isolated from the cooled reaction mixture by precipitated with acetone, filtration and drying in a vacuum oven at 50°. Yield was 75.0, grams $M_n$=67,000.

The PE-b-PS described above was used as a compatibiliser in a polymer blend of HDPE and polystyrene (PS). The HDPE (HTA 002) was sourced from ExxonMobil and the PS (product code: 430102) was purchased from Sigma Aldrich. A table of data for polymers used in the blending process is shown in Table 1.

TABLE 1

Materials used in the polymer blends.

| Material | $M_n$ (g/mol) | $M_w$ (g/mol) | Đ |
|---|---|---|---|
| HDPE (HTA 002) | 17,000 | 149,000 | 8.7 |
| PS (430102) | 90,000 | 333,000 | 3.7 |
| PE-b-PS | 67,000 | 157,000 | 2.4 |

A Thermo Scientific Haake Minilab II Twin Screw Extruder was used to create the blends. 5 g blends were created in the weight percent ratio of HDPE/PS: 10/90. Samples were prepared with 0 wt %, 1 wt % and 5 wt % of added PE-b-PS compatibiliser (ca 50 mg and 250 mg respectively). The temperature of the extruder was kept consistent at 160° C., and the screw speed was set at 80 rpm. HDPE, PS and PE-b-PS were added simultaneously, cycled for 5 min, extruded out of the machine, then re-cycled again for 5 minutes, and extruded once more. Blends were injection moulded into tensile testing bars at 160° C., conforming to ASTM D638-10 standard specification. At least 5 samples were tested for each blend ratio. Tensile testing was completed on a Shimadzu Autograph AGS-X Universal Tester at a speed of 1 mm/min.

Figure 2:
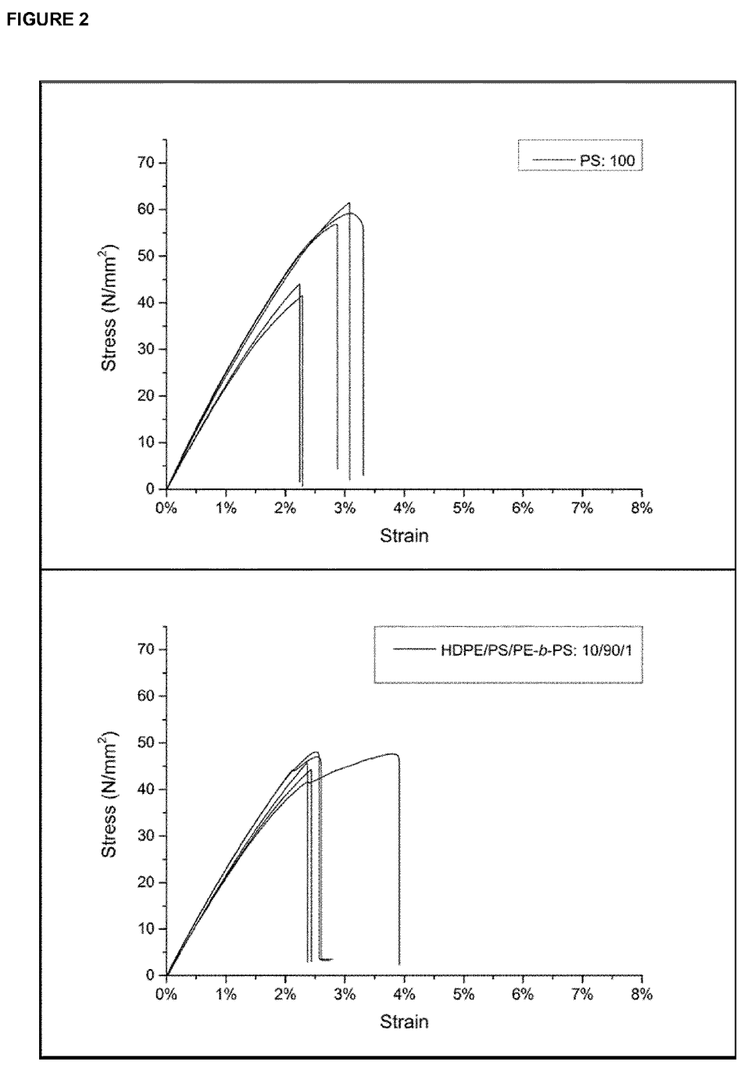
FIG. 2 is stress-strain curves corresponding to PS and HDPE/PS/PE-b-PS 10/90 blends with 0 wt %, 1 wt %, and 5 wt % of compatibilizer.

The stress-strain curves corresponding to PS and the 10/90 blends with 0 wt %, 1 wt % and 5 wt % of compatibiliser are shown in FIG. 2. Comparing the top two images shows the effect of adding 10 wt % of HDPE to a PS stream. It is clear from the stress strain curves shown that adding HDPE increases heterogeneity and that the blend is inconsistent in the tensile test. The two bottom images in FIG. 2 demonstrate the effect of adding the compatibiliser to the 10/90 mixture of HDPE/PS. Comparing the top right and the bottom left images shows the effect of adding 1 wt % of the compatibiliser according to this invention. The stress-strain curves became more 'styrene-like' and there is much less variability between the repeats compared with the uncompatibilised blend. Increasing the concentration of compatibiliser to 5 wt % (bottom right image) further reduced variability between the tensile test specimens and caused the blend to behave in a very similar way to virgin PS. Accordingly this shows that the interfacial adhesion between the polymers improved, due to the presence of the compatibiliser.

EXAMPLE 4

Figure 3:
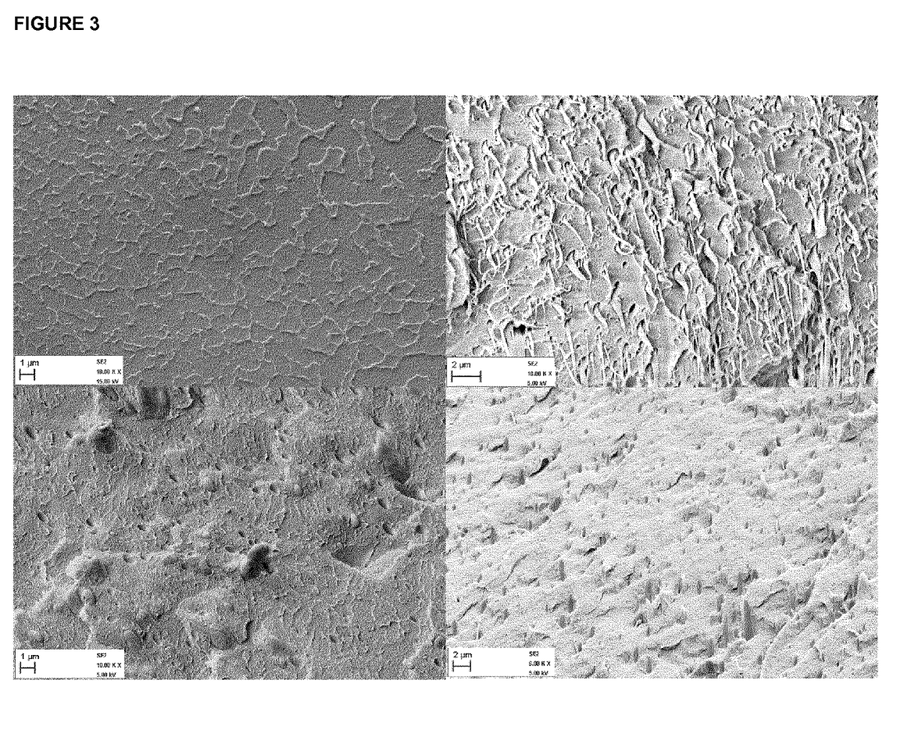
FIG. 3 is SEM images taken from cryo-fractured injection molded samples demonstrating the effect of a PE-b-PS compatibilizer on a polymer blend of High Density Polyethylene (HDPE) and Polystyrene (PS)
Figure 4:
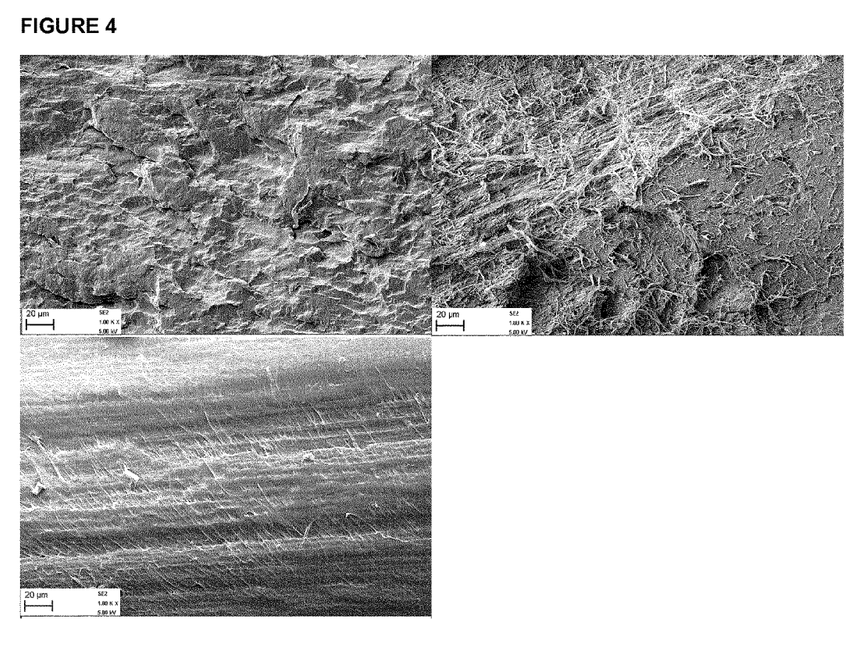
FIG. 4 is SEM images for a 90/10 blend of High Density Polyethylene (HDPE) and Polystyrene (PS)

The material prepared in Example 3 was tested as a compatibiliser for 10 to 90 blends of the same USPE and PS as used in Example 3. The scanning electron microscopy (SEM) images of the materials are shown in FIGS. 3 and 4. SEM analysis was performed on injection moulded samples. The SEM samples were prepared by cryofracturing tensile testing bars identical to those used to perform the tensile tests. The tensile testing bars were cooled in liquid nitrogen for 5 minutes and then shattered with a hammer. Shards of the tensile testing bar were adhered to an aluminium SEM stub with silver DAG (Acheson Silver DAG 1415 purchased from Agar Scientific), and coated in a thin film of gold (a few Å) with a sputter coater. SEM was performed on a Zeiss Sigma microscope.

The images in FIGS. 3 and 4 show the phase inconsistency of the mixture of the two incompatible polymers, viz. PS and PE (obtained by freeze-fracturing the compounded material) and beneficial effect of adding the compatibilising additive according to this invention.

FIG. 3 is four SEM images taken from cryo-fractured injection molded samples demonstrating the effect of a PE-b-PS compatibiliser on a polymer blend of High Density Polyethylene (HDPE) and Polystyrene (PS).

The top left SEM shows the virgin PS control. The image reveals an area which is entirely PS.

The top right image shows a 10/90 blend of HDPE/PS. the HDPE strands have been drawn out of the PS matrix during the fracturing process.

The bottom left image shows a 10/90/1 blend of HDPE/PS/PE-b-PS. The image shows the improvement in compatibility when 1% of the copolymer PE-b-PS is added according to this invention.

The bottom right image shows a 10/90/5 blend of HDPE/PS/PE-b-PS. The image shows the improvement in compatibility when 5% of the copolymer PE-b-PS is added according to this invention.

FIG. 4 is the images for a 90/10 blend of polystyrene and high density polyethylene.

The images show the phase inconsistency of the mixture of the two incompatible polymers, viz. PS and PE (obtained by freeze-fracturing the compounded material). It also shows the beneficial effect of adding the compatibilising PE-b-PS additive, viz. the block copolymer of this invention.

The top left image has no additive and image reveals an area which is entirely PS.

The top right image also has no additive and is the same sample as shown in the top left and shows an area that is rich in PE. It also shows that, within this area, the PE distribution is very inconsistent.

The bottom image has the additive added. The image shows the greater consistency and homogeneous distribution when 1% of the novel block copolymer PE-b-PS is added.

EXAMPLE 5

Figure 5:
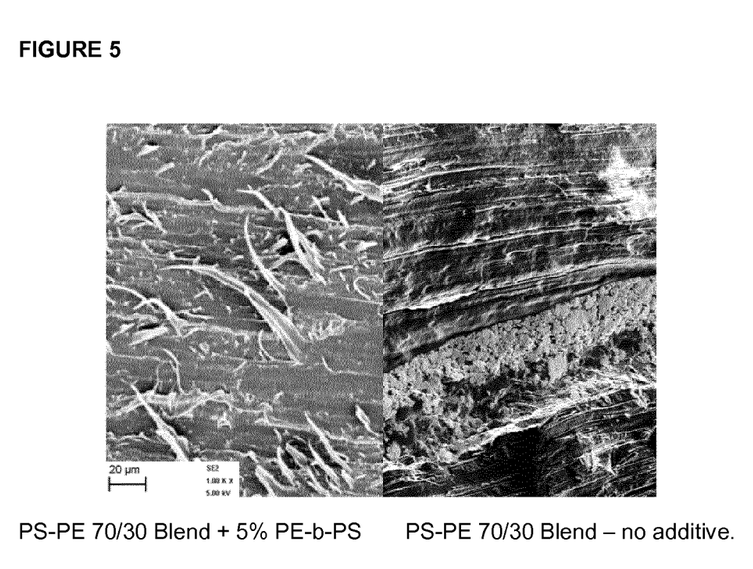
FIG. 5 is SEM images for a 70/30 blend of a High Density Polyethylene (HDPE) and Polystyrene (PS).

The tests of Example 4 were performed using a 70/30 blend of the same polystyrene and high density polyethylene (FIG. 5). The right-hand half of the image of FIG. 5 shows the phase inconsistency of the mixture of the two incompatible polymers, viz, PS and PE (obtained by freeze-fracturing the compounded material). The left-hand half of the image of FIG. 5 shows the greater consistency when 5% of the material PE-b-PS is added according to this invention showing that the PE is more evenly distributed.

The images show the phase inconsistency of the mixture of the two incompatible polymers, viz. PS and PE (obtained by freeze-fracturing the compounded material). The ratio of the two polymers is lower than in FIG. 4 which makes it more difficult to get a consistent phase structure. It also shows the beneficial effect of adding the PE-b-PS compatibilising additive.

The right-hand image is of a sample with no additive. The image reveals areas which are entirely PS, at the top and bottom of the image, interrupted by a band of PE. The distribution of phases (intermixing) is poor.

The left-hand image, the PE-b-PS Additive of the invention is added. The image shows the greater consistency when 5% of the novel block copolymer PE-b-PS is added. The PE is now more evenly distributed. The continuous phase is PS. The PE is much more evenly distributed within the matrix and the processing and freeze-fracturing has pulled part of the more flexible PE strands away from the newly fractured surface but they are still tightly bound within the matrix.

The image caption shows the conditions that were used to obtain the right-hand image at 1000× magnification on the SEM. The left hand image was obtained under the same conditions but at a magnification of 400× and the size adjusted in this frame to make it the same scale as the right-hand image.

The invention claimed is:

1. A mixture comprising a polymer and a material having the following structure:

wherein R and $R^1$ are the same or different and each independently represents an alkyl or aryl group, and X is hydrogen or a $C_1$ to $C_{20}$ alkyl group which is branched or linear;

wherein an aromatic ring substituent joined to polymer B is positioned meta or para to an aromatic ring substituent joined to polymer A; and wherein polymer A is a non-polar polymer formed by metallocene catalysis and polymer B is a polymer formed by radical catalysis of a polar monomer.

2. A mixture according to claim 1, wherein
i) polymer A comprises a chain of ethylenic structural units, copolymerised with 1-alkene co-monomers higher than ethylene;
ii) polymer B is derived from one or more α,β-unsaturated monomers selected from styrene, substituted styrene, acrylate, methacrylate and diene compounds and vinyl esters, fumarate esters, itaconate esters, maleic anhydride; and
iii) polymer B comprises a copolymer of the one or more α,β-unsaturated monomers with a $C_2$ to $C_6$ alkene.

3. A mixture of polymers, wherein the mixture of polymers comprises a polyolefin.

4. A mixture according to claim 1, wherein the polymer comprises a mixture of polymeric materials.

5. A mixture according to claim 4, wherein the mixture of polymeric material comprises a mixture of polar and non-polar materials or mixtures of polymeric materials of varying polarity.

6. A mixture according to claim 5, wherein the mixture comprises a mixture of polyolefins and ester group-containing polyesters, or alkene unsaturated ester copolymers, olefin vinyl acetate or acrylate ester copolymers.

7. A mixture according to claim 1, wherein polymer A has a backbone chain of polyethylenic structure units incorporating units derived from 1-alkenes higher than ethylene.

8. A mixture according to claim 1, wherein the aromatic ring substituent joined to polymer B is positioned meta to the aromatic ring substituent joined to polymer A.

9. A mixture according to claim 1, wherein polymer B comprises a chain of structural units derived from one or more α,β-unsaturated monomers selected from styrene, substituted styrene, acrylate and methacrylate esters, diene compounds, vinyl esters, fumarate esters, itaconate esters and maleic anhydride; and wherein polymer B comprises a copolymer of the one or more α,β-unsaturated monomers with a $C_2$ to $C_6$ alkene.

10. A mixture according to claim 1, wherein R and $R^1$ are alkyl groups having from 1 to 4 carbon atoms.

11. A mixture according to claim 9, wherein the aromatic ring substituent joined to polymer B is positioned meta to the aromatic ring substituent joined to polymer A.

12. A mixture according to any of claim 6, wherein polymer B consists of a chain of structural units derived from one or more α,β-unsaturated monomers selected from styrene, substituted styrene, acrylate and methacrylate esters, diene compounds, vinyl esters, fumarate esters, itaconate esters and maleic anhydride copolymerised with a $C_2$ to $C_8$ alkene.

13. A mixture according to claim 1, wherein polymer A is a polyolefin and polymer B is derived from styrene, alpha-methyl styrene, para-methyl styrene and para-butyl styrene or methacrylate.

14. A mixture according to claim 1, wherein the polymer comprises a recycled polymer.

15. A mixture according to claim 14, wherein the polymer comprises at least two recycled polymers.

* * * * *

UNITED STATES PATENT AND TRADEMARK OFFICE
CERTIFICATE OF CORRECTION

PATENT NO.         : 10,100,140 B2
APPLICATION NO.    : 15/698892
DATED              : October 16, 2018
INVENTOR(S)        : Scott et al.

Page 1 of 1

It is certified that error appears in the above-identified patent and that said Letters Patent is hereby corrected as shown below:

Column 18, Line 34:
Delete "Claim 6" and replace with --Claim 9--

Signed and Sealed this
Twenty-seventh Day of November, 2018

Andrei Iancu
*Director of the United States Patent and Trademark Office*